United States Patent [19]

Lee et al.

[11] Patent Number: 5,581,195

[45] Date of Patent: Dec. 3, 1996

[54] SEMICONDUCTOR CHIP HOLDING DEVICE

[75] Inventors: Kyu J. Lee, Seoul; Hyeon J. Jeong, Songtan, both of Rep. of Korea

[73] Assignee: Samsung Electronics Co., Ltd., Kyungki-do, Rep. of Korea

[21] Appl. No.: 345,447

[22] Filed: Nov. 21, 1994

[30] Foreign Application Priority Data

Nov. 20, 1993 [KR] Rep. of Korea .................. 93-24827

[51] Int. Cl.⁶ .................................................. G01R 31/02
[52] U.S. Cl. ................. 324/755; 324/765; 439/73; 439/330
[58] Field of Search .................................. 324/754, 755, 324/757, 765; 361/220; 439/70, 71–73, 330

[56] References Cited

U.S. PATENT DOCUMENTS

| | | | |
|---|---|---|---|
| 4,725,918 | 2/1988 | Bakker | 361/220 |
| 5,057,031 | 10/1991 | Sinclair | 439/261 |
| 5,288,240 | 2/1994 | Savant | 439/70 |
| 5,322,446 | 6/1994 | Cearley-Cabbiness | 439/73 |
| 5,348,489 | 9/1994 | Yeh | 439/153 |

*Primary Examiner*—Ernest F. Karlsen
*Assistant Examiner*—Russell M. Kobert
*Attorney, Agent, or Firm*—Cushman Darby & Cushman; Intellectual Property Group of Pillsbury Madison & Sutro LLP

[57] ABSTRACT

An appartus for testing bare semiconductor chips, especially for burn-in testing, includes a chip holding socket which comprises a substrate portion having at least one pair of opposing grooves formed along respective edges thereof. A pair of resilient elongate members are inserted into the grooves, and act to hold a respective bare chip in the holding socket. Preferably, a plurality of such holding sockets are mounted and electrically connected to a main test board, by which test signals are provided to test the bare semiconductor chips. A method for manufacturing such a testing apparatus is also disclosed herein.

9 Claims, 3 Drawing Sheets

SEMICONDUCTOR CHIP HOLDING DEVICE

BACKGROUND OF THE INVENTION

1. Field of the Invention

The present invention relates to a semiconductor chip holding device for testing bare chips and a method for fabricating such a device. More particularly, the present invention relates to a semiconductor chip holding device used during a burn-in test for testing bare chips in manufacturing a known good die array (hereinafter referred to as a "KGD" array), and a method for fabricating such a semiconductor chip holding device.

2. Description of Related Art

Generally, integrated circuit (IC) chips are necessarily subjected to alternating current (AC) and burn-in tests in the course of manufacturing semiconductor devices. These tests are performed to identify defective IC chips.

Electrically connecting an ordinary bare IC chip to a test pattern generating circuit is generally impossible unless the chip is packaged. Thus, the AC and burn-in tests are generally carried out by first packaging the IC chip using molding compound.

Meanwhile, a current bare chip holding methods in manufacturing the KGD array include tape automated bonding (TAB) and a temporary packaging method.

In the TAB method, a bare chip is mounted onto one side of tape leads (which is an insulating film with metal film leads thereon) by interposing solder bumps. The other ends of the leads are connected to test terminals for testing.

The tape carrier according to the TAB method is disadvantageous in that the tape carrier cannot be used repeatedly.

In the temporary packaging method, a bare chip or a flip chip which is to be tested is mounted on a ceramic substrate within a test housing, using an adhesive tape. Then, bonding pads of the chip are connected to contact pads within the ceramic substrate via wires, and the test housing is installed in a burn-in test board to perform a burn-in test.

Thereafter, the wires are removed from the bonding pads after the test. At this time, the bonding pads are left with a trace (from the wires) that degrades the reliability of the chip. Also, the ceramic substrate is relatively complicated in its structure and is limited to only one kind, which undesirably result in costs being increased during the manufacturing of the ceramic substrate.

Therefore, the present invention avoids the restrictions of the tape carrier according to the TAB method and the complicated design of the test housing according to the temporary housing, but employs a semiconductor chip holding device used to burn-in test to solve the above-described problems.

SUMMARY OF THE INVENTION

The present invention is devised to solve the above-described problems. Accordingly, it is an object of the present invention to provide a semiconductor chip holding device used for burn-in testing. Semiconductor chips which will be tested are mounted in the chip holding unit having a metal pattern and vacuum holes of a predetermined shape in a semiconductor substrate.

It is another object of the present invention to provide a method for manufacturing such a semiconductor chip holding device capable of processing a large number of known good dies at the same time. Such a method includes fabricating a plurality of chip holding units of different shapes which are mounted to a main test board and then mounting semiconductor chips which will be tested to the chip holding units.

To achieve the above and other objects of the present invention, a semiconductor chip holding device used for burn-in testing is provided, including a plurality of rectangular semiconductor substrates. The semiconductor chip holding device includes semiconductor chip supporters for receiving bare chips projecting from the outermost peripheries of each rectangular semiconductor substrate, and a main test board for testing the bare chips to determine whether they are defective or not.

To achieve another object of the present invention, a method for fabricating a semiconductor chip holding device used for burn-in test is provided. Here, insertion holes of a predetermined shape are formed along the outermost periphery of at least one rectangular semiconductor substrate. Resilient members (preferably metallic) are then inserted in the insertion holes to project from an upper plane of the semiconductor substrate. The at least one semiconductor substrate is then mounted onto a main test board. At least one bare chip is mounted on the semiconductor substrate so as to be supported by the metal members projecting from the upper plane of the semiconductor substrate.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE INVENTION

Figure 1:
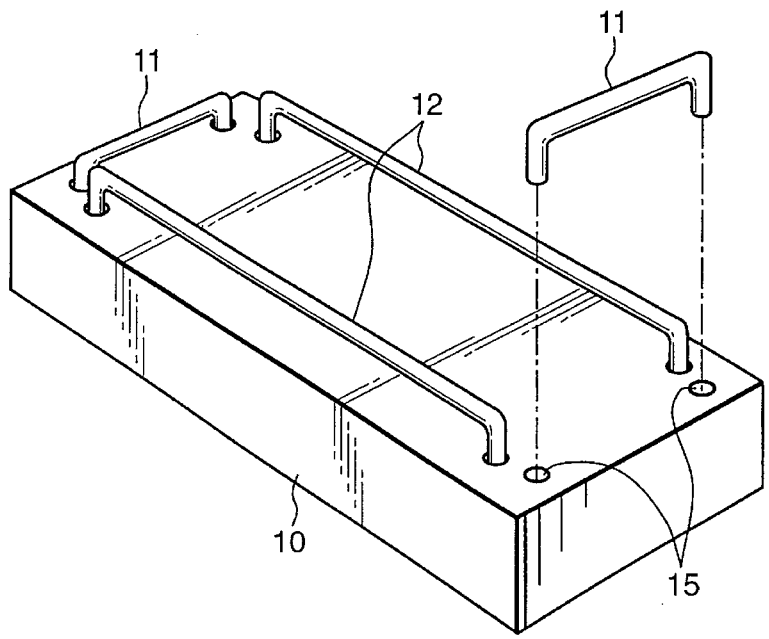
FIG. 1 is a perspective view showing one embodiment of a semiconductor chip holding device used for burn-in test according to the present invention.

Referring to FIG. 1, a semiconductor chip holding device used for burn-in test according to the present invention includes a generally rectangular semiconductor substrate 10 and semiconductor chip supporters 11 and 12.

The above semiconductor chip holding device for burn-in test is provided by boring elongated holes 15 at the outermost periphery of the semiconductor substrate 10, and inserting semiconductor chip supporters 11 and 12 in the holes 15. The semiconductor chip supporters 11 and 12 can be formed from metal wire of suitable diameter, metal plate, or a spring, all of which should have an elastic property.

Figure 2:
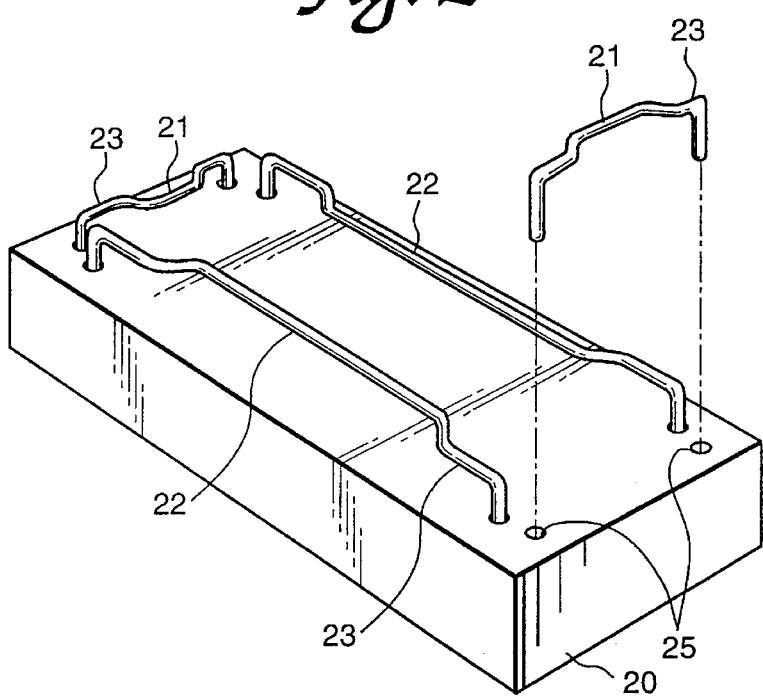
FIG. 2 is a perspective view showing another embodiment of the semiconductor chip holding device used for burn-in test according to the present invention.

FIG. 2 is a perspective view showing a second embodiment of the semiconductor chip holding device used for burn-in test, according to the present invention.

The semiconductor chip holding device for burn-in test according to the second embodiment of the present invention includes a rectangular semiconductor substrate 20, and semiconductor chip supporters 21 and 22, in which the semiconductor chip supporters 21 and 22 have a prescribed elasticity due to centrally-bent portions 23.

The outermost periphery of the semiconductor substrate 20 is bored to provide holes 25 receiving the inwardly-bent portions 23, and the semiconductor chip supporters 21 and 22 are inserted in the holes 25. The structures of the semiconductor chip supporters 21 and 22 are the same as those described with reference to FIG. 1.

Figure 3:
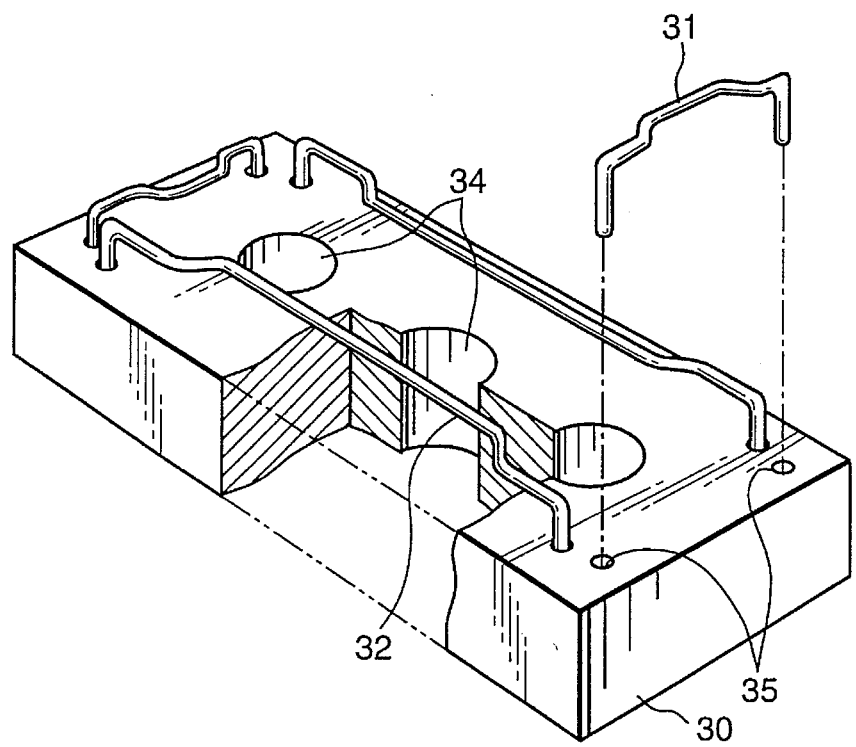
FIG. 3 is a perspective view showing still another embodiment of the semiconductor chip holding device used for burn-in test according to the present invention.

FIG. 3 is a perspective view showing still another embodiment of the semiconductor chip holding device used for burn-in testing according to the present invention.

This semiconductor chip holding device is similar to that illustrated in FIG. 2, but has at least one vacuum hole 34 formed in the central portion of a semiconductor substrate 30, in addition to semiconductor chip supporters 31 and 32.

The vacuum holes 34 permit the use of a vacuum tool (not shown) to prevent floating of the semiconductor chip holding device during the burn-in test.

Figure 4:
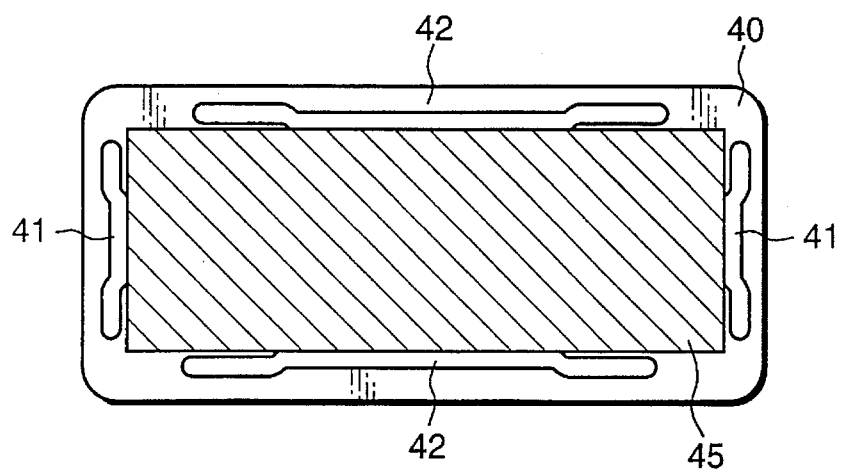
FIG. 4 is a plan view showing a bare chip mounted on the semiconductor chip holding device used for burn-in test shown in FIGS. 2 or 3.

FIG. 4 is a plan view showing a bare chip mounted on the semiconductor chip holding device such as those shown in FIGS. 2 and 3.

Here, a bare chip 45 is held by semiconductor chip supporters 41 and 42 projecting from the upper plane of a semiconductor substrate 40, which is settled by the semiconductor chip supporters 41 and 42 for facilitating the separation after carrying out the burn-in test. A method for electrically connecting the bare chip 45 to substrate 40 is conventional.

Figure 5:
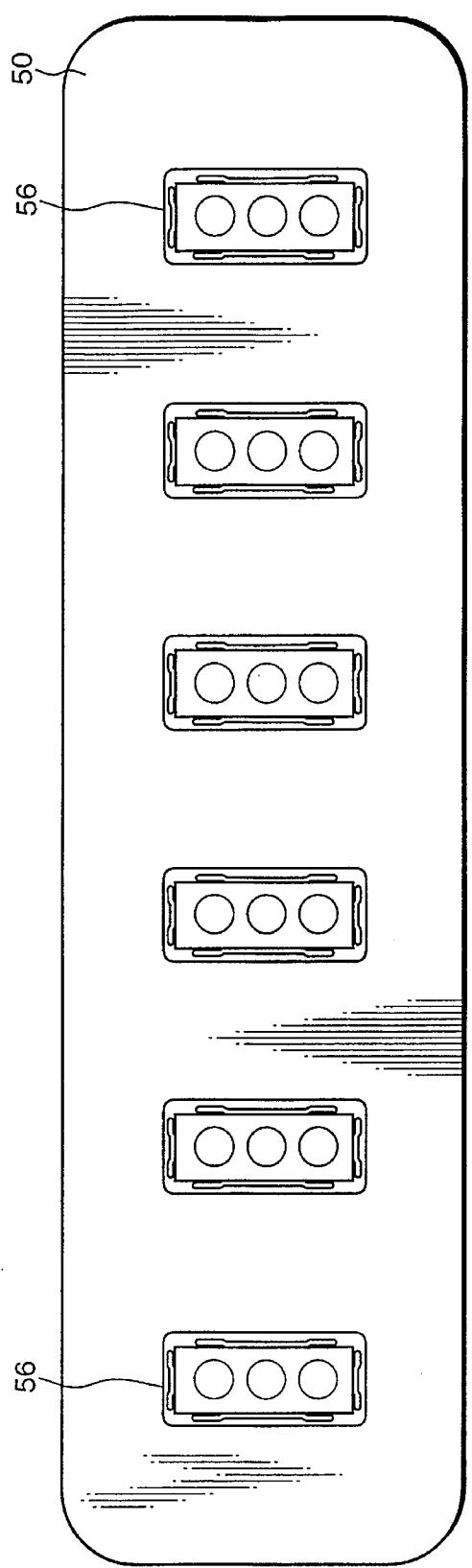
FIG. 5 is a plan view showing a plurality of semiconductor chip holding devices according to the present invention arranged on a test board.

FIG. 5 is a plan view showing a plurality of semiconductor chip holding devices used for burn-in testing arranged on a test board.

In view of the illustrated construction, it can be easily noted that at least one semiconductor chip holding device for burn-in test individually formed as shown in FIG. 3 is mounted onto a main test board 50. Even though the semiconductor chip holding device for burn-in test of FIG. 3 is applied onto a main test substrate 50, the semiconductor chip holding devices for burn-in test according to FIGS. 1 and 2 can be applied, respectively. A method for electrically connecting chip holding devices 56 to main test board 50 is conventional.

Figure 6:
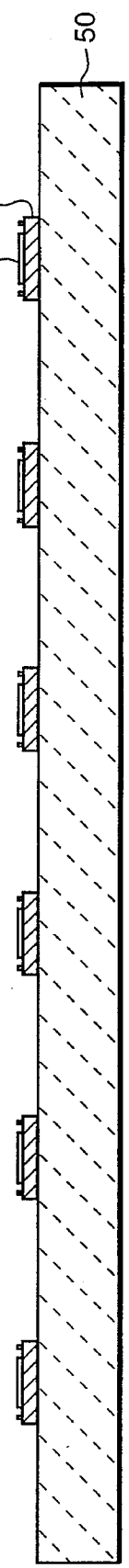
FIG. 6 is a side sectional view showing a plurality of the semiconductor chip holding devices according to FIG. 2.

Therefore, as shown in FIG. 6, at least one semiconductor chip holding device 56 for burn-in test is mounted on the main test board 50, and at least one bare chip 57 is mounted to the respective semiconductor chip holding device 56 for burn-in testing, thereby conducting the following process.

As a result, in the semiconductor chip holding device used for burn-in test and fabricating method therefor according to the present invention, insertion holes having a predetermined shape are formed in the outermost periphery of at least one semiconductor substrate, resilient members (preferably metallic) are inserted into the holes so as to project upwardly from the upper plane of the semiconductor substrate. At least one such semiconductor substrate is then mounted onto a main test board. Then, a plurality of bare chips are supported by the resilient members projecting from the upper plane of the semiconductor substrate so as to be mounted. Thus, the semiconductor chips to be tested are mounted on a chip holding unit so that a large number of KGDs can be tested at once.

As described above, the semiconductor chip holding device used for burn-in test and fabricating method therefor according to the present invention can fabricate the semiconductor chip holding device which will be mounted to the main test board in various shapes, it will be understood by those skilled in the art that various changes in form and details may be effected therein without departing from the spirit and scope of the invention as defined by the appended claims.

What is claimed is:

1. A semiconductor chip holding socket comprising:
   a substrate portion having at least two opposing edges, said substrate portion having:
      at least one insertion hole provided at each of said opposing edges of said substrate portion; and
   at least one vacuum hole formed therethrough, said at least one vacuum hole being adapted to communicate with a vacuum-creating device; and
   at least two elongate semiconductor chip holding members constructed and arranged to hold a semiconductor chip therebetween on said substrate portion, each said semiconductor chip holding member being received in a respective said insertion hole so as to project from said substrate portion, each said semiconductor chip holding member being elastic in a direction perpendicular to its direction of elongation.

2. A semiconductor chip holding socket as claimed in claim 1, wherein two said insertion holes are provided at each of said opposing edges of said substrate portion, wherein each said semiconductor chip holding member comprises a metal wire portion having respective ends which are received in said two insertion holes.

3. A semiconductor chip holding socket as claimed in claim 1, wherein each said semiconductor chip holding member has an intermediate portion which is offset towards a center of said substrate portion.

4. A semiconductor chip holding socket as claimed in claim 1, wherein each said semiconductor chip holding member comprises a plate spring.

5. A semiconductor chip testing apparatus for testing semiconductor chips, the apparatus comprising:
   at least one semiconductor chip holding socket into which a semiconductor chip is received, said at least one socket comprising:
      a substrate portion having at least two opposing edges; at least one insertion hole provided in said substrate portion at each of said opposing edges; and at least one vacuum hole formed through said substrate portion, said at least one vacuum hole being adapted to communicate with a vacuum-recreating device; and
   at least two elongate semiconductor chip holding members constructed and arranged to hold a semiconductor chip on said substrate portion and received in a respective said insertion hole so as to project from said substrate portion, each said semiconductor chip holding member being elastic in a direction perpendicular to its direction of elongation; and
   a main test board onto which said at least one semiconductor chip holding socket is mounted, said at least one semiconductor chip holding socket and said main test board being electrically connected.

6. A testing apparatus as claimed in claim 5, wherein two said insertion holes are provided at each of said opposing edges of said substrate portion, wherein each said semiconductor chip holding member comprises a metal wire portion having respective ends which are received in said two insertion holes.

7. A testing apparatus as claimed in claim 5, wherein each said semiconductor chip holding member has an intermediate portion which is offset towards a center of said substrate portion.

8. A testing apparatus as claimed in claim 5, wherein each said semiconductor chip holding member comprises a plate spring.

9. A semiconductor chip-holding device for burn-in testing a bare semiconductor chip, comprising:

a test substrate having a surface bounded by an outer perimeter; said test substrate having four pairs of openings therein, through said surface, each pair bordering a respective increment of said perimeter; a first two of said increments being opposite one another, and a second two of said increments opposing one another, between said first two, so as to define a rectangular area on said surface bounded by said four pairs of openings;

four chip supporters each of generally inverted and squared U-shaped shape in elevation, so as to have an intermediate portion generally paralleling said surface, and two end portions which project in a same direction generally normal to said surface;

each said chip supporter having said end portions socketed in a respective pair of said openings, so that said chip supporters collectively border said area, with spacing from said surface, whereby said chip supporters are arranged to collectively grip a bare semiconductor chip, perimetrically thereof, as the chip is urged among them and into engagement with said surface;

each said chip supporter intermediate portion being elastically flexible towards and away from centrally of said area, so that the chip when urged among them is resiliently engaged about the perimeter of the chip, by the intermediate portions of all four of said chip supporters.

\* \* \* \* \*